US008729908B2

(12) United States Patent
Cranford, Jr. et al.

(10) Patent No.: US 8,729,908 B2
(45) Date of Patent: May 20, 2014

(54) STATIC NOISE MARGIN MONITORING CIRCUIT AND METHOD

(75) Inventors: Hayden C. Cranford, Jr., Cary, NC (US); Terence B. Hook, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 13/407,822

(22) Filed: Feb. 29, 2012

(65) Prior Publication Data
US 2013/0221987 A1    Aug. 29, 2013

(51) Int. Cl.
*G01R 29/26*    (2006.01)

(52) U.S. Cl.
USPC ........... 324/613; 324/600; 324/612; 324/614; 365/154; 365/156; 365/201; 365/206; 455/62; 455/296; 455/501

(58) Field of Classification Search
CPC ... G01R 29/26; G01R 23/20; G01R 31/31708
USPC .......... 324/613, 600, 612; 365/154, 156, 201, 365/206; 455/62, 296, 501
See application file for complete search history.

(56) References Cited

U.S. PATENT DOCUMENTS

| | | | |
|---|---|---|---|
| 7,099,182 B2 | 8/2006 | Ohtake et al. | |
| 7,385,864 B2 * | 6/2008 | Loh et al. | 365/201 |
| 7,423,899 B2 | 9/2008 | Tang et al. | |
| 7,672,187 B2 | 3/2010 | Lih et al. | |
| 7,710,191 B2 | 5/2010 | Inada et al. | |
| 7,751,270 B2 | 7/2010 | Geens et al. | |
| 7,817,490 B1 | 10/2010 | Sridhara | |
| 2001/0012320 A1* | 8/2001 | Watanabe et al. | 375/226 |
| 2006/0145908 A1* | 7/2006 | Lee | 341/161 |
| 2008/0205609 A1 | 8/2008 | Zhou | |
| 2010/0123447 A1* | 5/2010 | Vecera et al. | 323/290 |

OTHER PUBLICATIONS

Calhoun, et al., "Analyzing Static Noise Margin for Sub-threshold SRAM in 65 nm CMOS," IEEE, Solid-State Circuits Conference, 2005, ESSCIR 2005, Proceedings of the 31st European, Sep. 12-16, 2005, pp. 363-366.
U.S. Appl. No. 13/307,245, filed Nov. 30, 2011, Braceras, et al.
U.S. Appl. No. 13/005,560, filed Jan. 31, 2011, Abou-Khalil, et al.

* cited by examiner

*Primary Examiner* — Matthew W Such
*Assistant Examiner* — David Frederiksen
(74) *Attorney, Agent, or Firm* — Gibb & Riley, LLC; David A. Cain, Esq.

(57) ABSTRACT

A monitoring circuit and method, wherein a voltage waveform having a linear falling edge is applied to a first node of at least one test memory cell (e.g., a plurality of test memory cells connected in parallel). The input voltage at the first node is captured when the output voltage at a second node of the test memory cell(s) rises above a high reference voltage during the falling edge. Then, a difference is determined between the input voltage as captured and either (1) the output voltage at the second node, as captured when the input voltage at the first node falls below the first reference voltage during the falling edge, or (2) a low reference voltage. This difference is proportional to the static noise margin (SNM) of the test memory cell(s) such that any changes in the difference noted with repeated monitoring are indicative of corresponding changes in the SNM.

20 Claims, 10 Drawing Sheets

STATIC NOISE MARGIN MONITORING CIRCUIT AND METHOD

BACKGROUND

1. Field of the Invention

The embodiments disclosed herein relate to the static noise margin (SNM) of static random access memory (SRAM) cells in an SRAM array and, more specifically, to a circuit and method for repeatedly monitoring the SNM of SRAM cells in an SRAM array

2. Description of the Related Art

Those skilled in the art will recognize that size and power scaling are key factors considered in modern integrated circuit design. One common technique for power scaling is to reduce the power supply voltage. However, reducing the power supply voltage to a static random access memory (SRAM) cell can cause the SRAM cell to be more susceptible to stability failures (i.e., memory fails). Specifically, reducing the power supply voltage to an SRAM cell below a certain minimum voltage level will reduce the SRAM cell's static noise margin (SNM). The SNM refers to the amount of external DC voltage noise required to change the state of the SRAM cell. Thus, when the SNM is reduced, so is the amount of voltage noise required for data stored in the SRAM cell to be lost. Furthermore, the SNM of an SRAM cell will degrade (i.e., will be reduced) over time due to various aging mechanisms, also referred to as performance degradation mechanisms associated with the various transistors within the SRAM cell. Such aging mechanisms include, but are not limited to, gate oxide integrity (GOI), negative bias temperature instability (NBTI), positive bias temperature instability (BTI), and gate oxide hot carrier injection (HCI). Therefore, it would be advantageous to provide a circuit and method capable of repeatedly monitoring the SNM of SRAM cells in order to, for example, allow preemptive actions to be taken to prevent stability fails.

SUMMARY

In view of the foregoing, disclosed herein are embodiments of a static noise margin (SNM) monitoring circuit and method. In these embodiments, a voltage waveform having a linear falling edge can be generated (e.g., by a voltage waveform generator) and applied to a first node of at least one test memory cell (e.g., a plurality of test memory cells connected in parallel). The input voltage at the first node can be captured (e.g., by a sample and hold device) at a point in time when the output voltage at a second node of the test memory cell(s) rises above a high reference voltage during the falling edge of the voltage waveform. Then, a voltage difference can be determined (e.g., by a voltmeter) between the input voltage, as captured, and either (1) the output voltage at the second node, as captured (e.g., by another sample and hold device) at an earlier point in time when the input voltage at the first node fell below the first reference voltage during the falling edge, or (2) a low reference voltage. This difference will be proportional to the SNM of the test memory cell(s) such that any changes in this difference as noted with repeated monitoring will be indicative of corresponding changes in the SNM. Based on these changes, preemptive action can be taken to prevent memory cell stability fails.

More particularly, discloses herein are embodiments of a static noise margin (SNM) monitoring circuit.

In one embodiment, the SNM monitoring circuit can comprise a test memory cell (e.g., a test static random access memory (SRAM) cell). The test memory cell can have a first node and a second node. The SNM monitoring circuit can further comprise a voltage waveform generator, a reference voltage generator, first and second sample and hold devices and a voltmeter. The voltage waveform generator can be electrically connected to the first node, can generate a voltage waveform having a linear falling edge (e.g., a triangular waveform or a sawtooth waveform), and can apply that voltage waveform to the first node. The reference voltage generator can generate a reference voltage and, particularly, a relatively high reference voltage (e.g., a reference voltage that is 0.75-0.9 times the power supply voltage (Vdd)). The first sample and hold device can capture the output voltage of the test memory cell at the second node at a first point in time when the input voltage of the test memory cell at the first node falls below the reference voltage during the falling edge of the voltage waveform. The second sample and hold device can capture the input voltage at the first node at a second point in time when the output voltage at the second node rises above the reference voltage during the same falling edge of the voltage waveform. Then, the voltmeter can determine the difference between the output voltage, as captured by the first sample and hold device at the first point in time, and the input voltage, as captured by the second sample and hold device at the second point in time. This difference will be proportional to the SNM of the test memory cell such that any changes in this difference as noted with repeated monitoring will be indicative of corresponding changes in the SNM. Optionally, rather monitoring the SNM of a single test memory cell, the SNM monitoring circuit can incorporate a plurality of test memory cells connected in parallel at the first and second nodes so that the resulting difference between the captured node voltages represents a more accurate average difference.

In another embodiment, the SNM monitoring circuit can similarly comprise a test memory cell (e.g., a test static random access memory (SRAM) cell). The test memory cell can have a first node and a second node. In this embodiment, the SNM monitoring circuit can further comprise a voltage waveform generator, first and second reference voltage generators, a sample and hold devices, and a voltmeter. The voltage waveform generator can be electrically connected to the first node, can generate a voltage waveform having a linear falling edge (e.g., a triangular waveform or a sawtooth waveform), and can apply that voltage waveform to the first node. The first reference voltage generator can generate a first reference voltage and, particularly, a relatively high reference voltage (e.g., a reference voltage that is 0.75-0.9 times the power supply voltage (Vdd)). The second reference voltage generator can generate a second reference voltage and, particularly, a relatively low reference voltage (e.g., a reference voltage that is lower than the first reference voltage). The sample and hold device can capture the input voltage at the first node of the test memory cell at a point in time when the output voltage of the test memory cell at the second node rises above the first reference voltage (i.e., the high reference voltage) during the falling edge of the voltage waveform. Then, the voltmeter can determine the difference between the input voltage, as captured by the sample and hold device, and the second reference voltage (i.e., the low reference voltage). As in the previously described embodiment, this difference will be proportional to the SNM of the test memory cell such that any changes in this difference as noted with repeated monitoring will be indicative of corresponding changes in the SNM. Optionally, rather monitoring the SNM of a single test memory cell, the SNM monitoring circuit can incorporate a plurality of test memory cells connected in parallel at the first and second nodes so that the resulting difference between the captured node voltage and the second reference voltage (i.e., the low reference voltage) represents a more accurate average difference.

Also disclosed herein are embodiments of a static noise margin (SNM) monitoring method. The method embodiments can comprise generating (e.g., by a voltage waveform generator) a voltage waveform having a linear falling edge (e.g., a triangular waveform or a sawtooth waveform). This voltage waveform can be applied to a first node of a test memory cell (e.g., a test static random access memory (SRAM) cell).

In one embodiment, the SNM monitoring method can further comprise generating (e.g., by a reference voltage generator) a reference voltage and, particularly, a relatively high reference voltage (e.g., a reference voltage that is 0.75-0.9 times the power supply voltage (Vdd)). Then, the output voltage of the test memory cell at a second node can be captured (e.g., by a first sample and hold device) at a first point in time when the input voltage of the test memory cell at the first node falls below the reference voltage during the falling edge of the voltage waveform. Additionally, the input voltage at the first node can be captured (e.g., by a second sample and hold device) at a second point in time when the output voltage at the second node rises above the reference voltage during the same falling edge of the voltage waveform. Then, the difference between the output voltage, as captured at the first point in time, and the input voltage, as captured at the second point in time, can be determined (e.g., by a voltmeter). This difference will be proportional to the SNM of the test memory cell such that any changes in this difference as noted with repeated monitoring will be indicative of corresponding changes in the SNM. Optionally, rather monitoring the SNM of a single test memory cell, the SNM monitoring method can incorporate a plurality of test memory cells connected in parallel at the first and second nodes so that the resulting difference between the captured node voltages represents a more accurate average difference.

In another embodiment, the SNM monitoring method can further comprise generating (e.g., by a first reference voltage generator) a first reference voltage and, particularly, a relatively high reference voltage (e.g., a reference voltage that is 0.75-0.9 times the power supply voltage (Vdd)). A second reference voltage and, particularly, a relatively low reference voltage (e.g., a reference voltage that is lower than the first reference voltage) can also be generated (e.g., by a second reference voltage generator). In this embodiment, the input voltage of the test memory cell at the first node can be captured (e.g., by a sample and hold device) at a point in time when the output voltage of the test memory cell at the second node rises above the first reference voltage during the falling edge of the voltage waveform. Then, the difference between the input voltage, as captured, and the second reference voltage (i.e., the low reference voltage) can be determined (e.g., by a voltmeter). As in the previously described embodiment, this difference will be proportional to the SNM of the test memory cell such that any changes in this difference as noted with repeated monitoring will be indicative of corresponding changes in the SNM. Optionally, rather monitoring the SNM of a single test memory cell, the SNM monitoring circuit can incorporate a plurality of test memory cells connected in parallel at the first and second nodes so that the resulting difference between the captured node voltage and the second reference voltage represents a more accurate average difference.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, those skilled in the art will recognize that size and power scaling are key factors considered in modern integrated circuit design. One common technique for power scaling is to reduce the power supply voltage. However, reducing the power supply voltage to a static random access memory (SRAM) cell can cause the SRAM cell to be more susceptible to stability failures (i.e., memory fails). Specifically, reducing the power supply voltage to an SRAM cell below a certain minimum voltage level will reduce the SRAM cell's static noise margin (SNM). The SNM refers to the amount of external DC voltage noise required to change the state of the SRAM cell. Thus, when the SNM is reduced, so is the amount of voltage noise required for data stored in the SRAM cell to be lost. Furthermore, the SNM of an SRAM cell will degrade (i.e., will be reduced) over time due to various aging mechanisms, also referred to as performance degradation mechanism, associated with the various transistors with the SRAM cell. Such aging mechanisms include, but are not limited to, gate oxide integrity (GOI), negative bias temperature instability (NBTI), positive bias temperature instability (PBTI), and gate oxide hot carrier injection (HCI). Therefore, it would be advantageous to provide a circuit and method capable of repeatedly monitoring the SNM of SRAM cells in order to, for example, allow preemptive actions to be taken to prevent stability fails.

In view of the foregoing, disclosed herein are embodiments of a static noise margin (SNM) monitoring circuit and method. In these embodiments, a voltage waveform having a linear falling edge can be generated (e.g., by a waveform generator) and applied to a first node of at least one test memory cell (e.g., a plurality of test memory cells connected in parallel). The input voltage at the first node can be captured (e.g., by a sample and hold device) at a point in time when the output voltage at a second node of the test memory cell(s) rises above a high reference voltage during the falling edge of the voltage waveform. Then, a voltage difference can be determined (e.g., by a voltmeter) between the input voltage as captured and either (1) the output voltage at the second node, as captured (e.g., by another sample and hold device) at an earlier point in time when the input voltage at the first node fell below the first reference voltage during the same falling edge, or (2) a low reference voltage. This difference will be proportional to the SNM of the test memory cell(s) such that any changes in this difference as noted with repeated monitoring will be indicative of corresponding changes in the SNM. Based on these changes, preemptive action can be taken to prevent memory cell stability fails.

Figure 1:
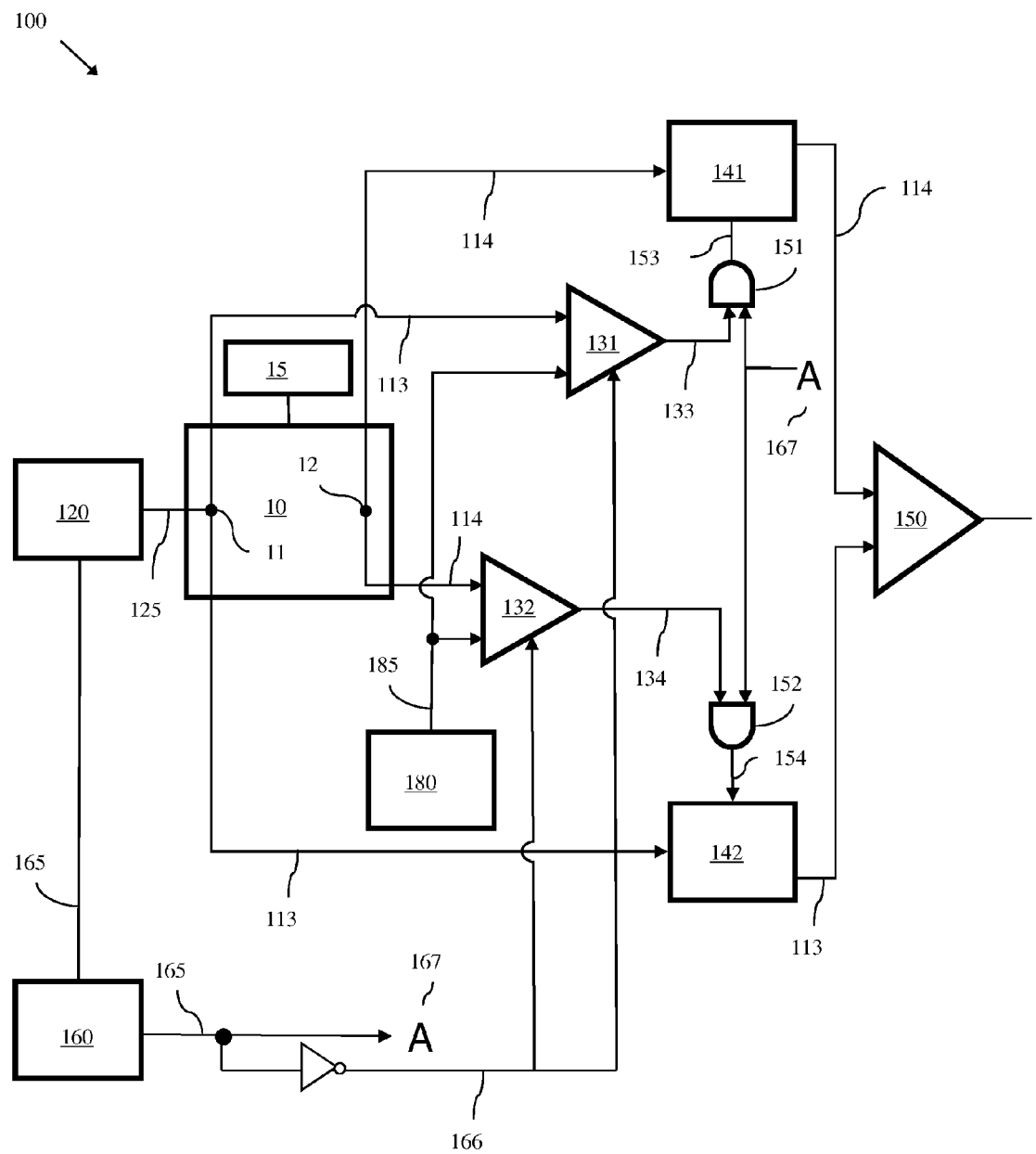
FIG. 1 is a schematic diagram illustrating an embodiment of a static noise margin (SNM) monitoring circuit for monitoring changes in the SNM of memory cells in a memory array.
Figure 2:
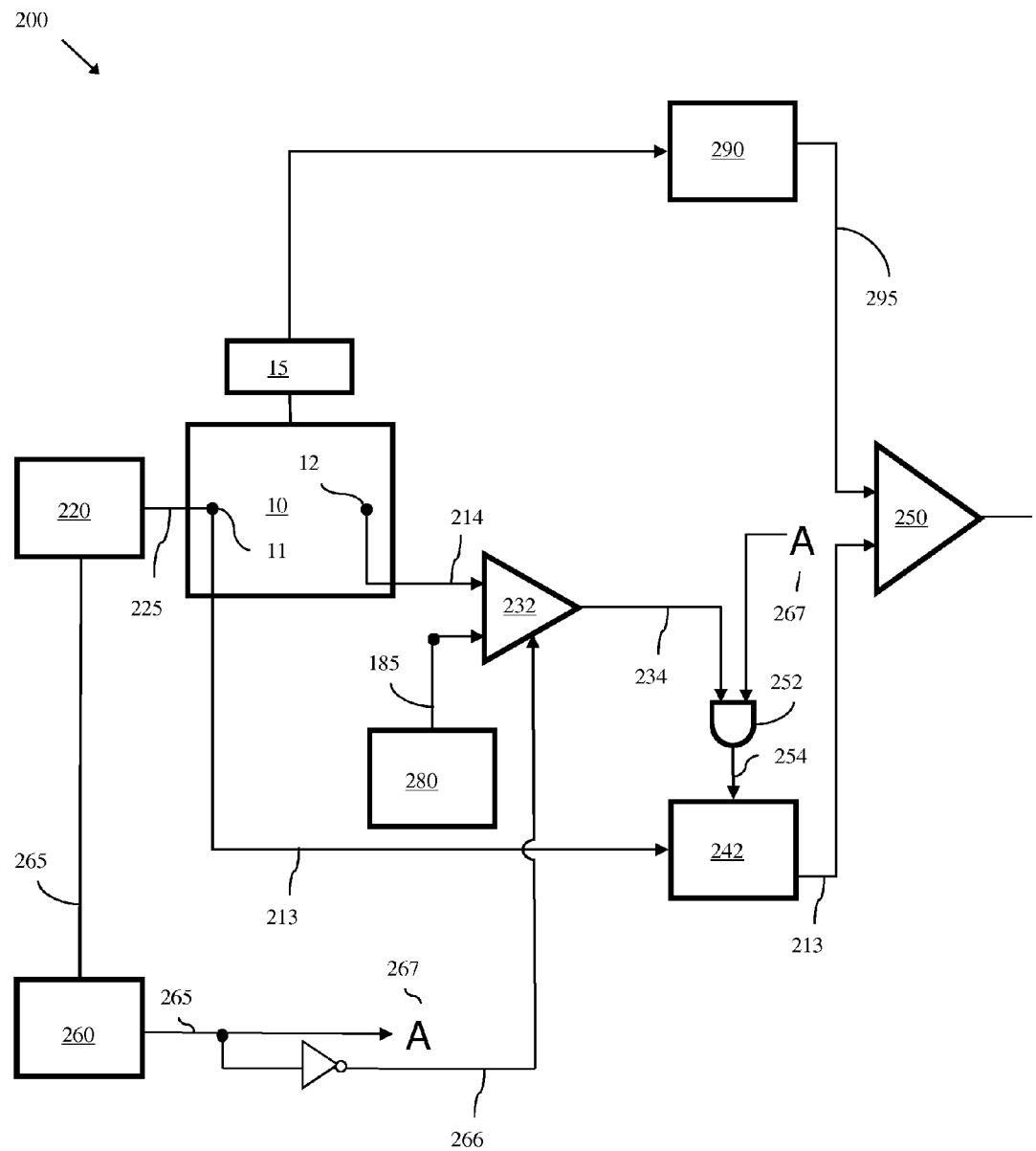
FIG. 2 is a schematic diagram illustrating another embodiment of a static noise margin (SNM) monitoring circuit for monitoring changes in the SNM of memory cells in a memory array.

More particularly, referring to FIGS. 1 and 2 disclosed herein are embodiments 100 and 200, respectively, of a static noise margin (SNM) monitoring circuit for monitoring changes in the SNM of memory cells in a memory array and, particularly, for monitoring changes in the SNM of static random access memory (SRAM) cells in an SRAM array. In each of the embodiments 100 and 200, the SNM monitoring circuit can comprise at least one test memory cell 10 on an integrated circuit chip, which also comprise a memory array comprising a plurality of memory cells (e.g., an SRAM array comprising a plurality of SRAM cells).

Figure 3:
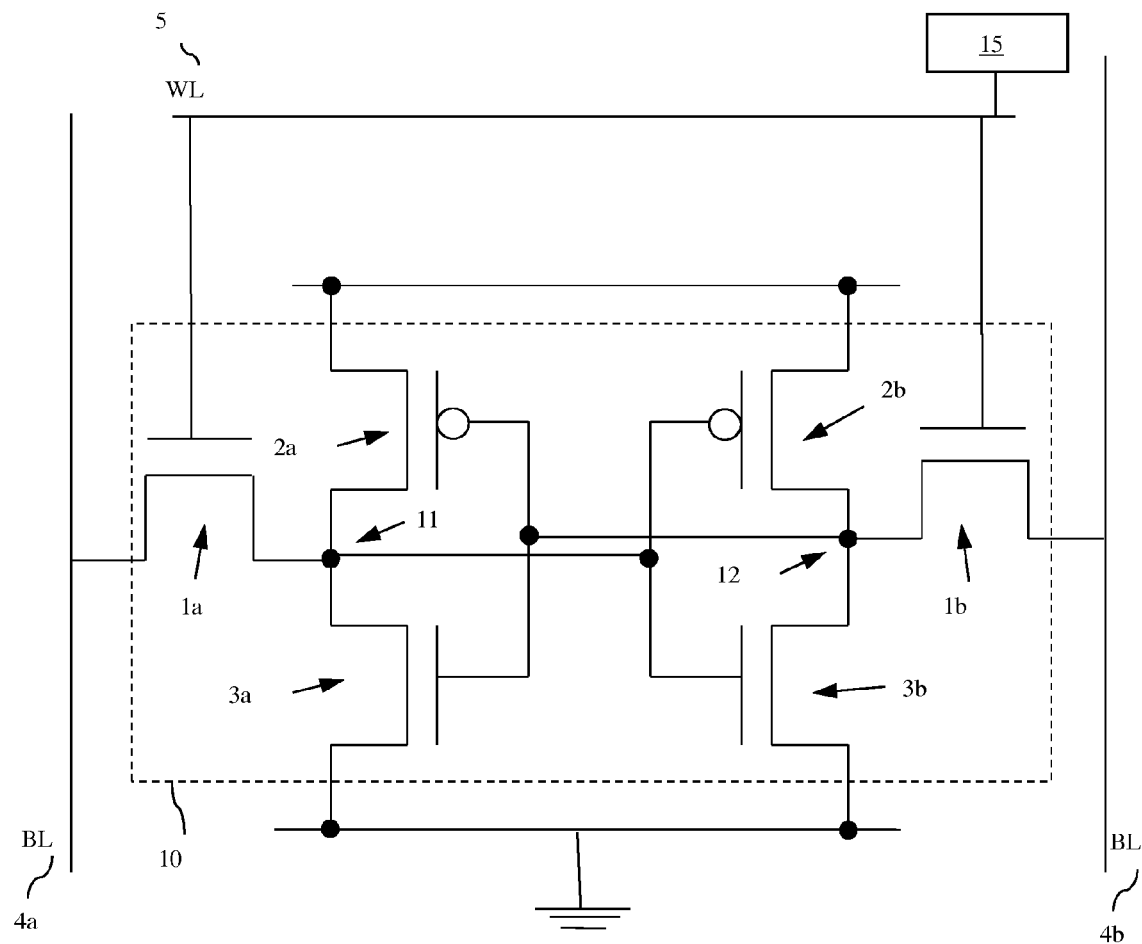
FIG. 3 is a schematic diagram illustrating an exemplary static random access memory (SRAM) cell.

Referring to FIG. 3, the test memory cell 10 can, for example, comprise a six-transistor (6T) SRAM cell. The 6T SRAM cell can comprise a pair of pass-gate transistors (i.e., a first pass-gate transistor 1a and a second pass-gate transistor 1b) and a pair of cross-coupled inverters. The first and second pass-gate transistors 1a, 1b can comprise, for example, N-type field effect transistors. Each inverter can comprise a pull-up transistor 2a, 2b (e.g., a P-type field effect transistor) connected in series to a pull-down transistor 3a, 3b (e.g., an N-type field effect transistor). The drain of the first pass-gate 1a can be connected to a first node 11 between the first pull-up transistor 2a and first pull-down transistor 3a of the first inverter. The drain of the second pass-gate transistor 1b can be connected to a second node 12 between the second pull-up transistor 2b and second pull-down transistor 3b of the second inverter. Furthermore, the source of the first pass-gate transistor 1a can be connected to a first bitline 4a of a complementary pair of bitlines and the source of the second pass-gate transistor 1b can be connected to a second bitline 4b in the complementary pair of bitlines. The pass-gate transistors 1a, 1b and, particularly, the gates of the pass-gate transistors 1a, 1b can be connected to a wordline (WL) 5.

A switch 15 can selectively control (i.e., can be adapted to selectively control, configured to selectively control, etc.) the test memory cell 10 and, particularly, the electrical connection between the wordline 5 and the gates of the pass-gate transistors 1a, 1b so as to allow the test memory cell 10 to operate in one of two different modes during which the SNM of the test memory cell 10 can be monitored: (1) a hold mode (also referred to as standby mode) and (2) read mode. Specifically, in the hold mode, the switch 15 ensures that the wordline 5 is not asserted. That is, the switch 15 ensures that the wordline 5 is not electrically connected to the gates of the pass-gate transistors 1a, 1b and, thus, that the nodes 11 and 12 are not electrically connected to the bitlines 4a, 4b, respectively. In the read mode, the bitlines 4a, 4b are both pre-charged high (e.g., to the supply voltage (Vdd)) and the switch 15 ensures that the wordline 5 is activated. That is, the switch 15 ensures that the wordline 5 is electrically connected to the gates of the pass-gate transistors 1a, 1b, thereby enabling the pass-gate transistors 1a, 1b in order to electrically connect the bitlines 4a, 4b to the nodes 11, 12, respectively.

It should be noted that, except as discussed in greater detail below with regard circuit components necessary to monitor the SNM of the test memory cell 10, the test memory cell 10 can have essentially the same design structure (e.g., the same types and sizes of transistors) as the memory cells in the memory array so that any changes that are noted in the SNM of the test memory cell 10 during monitoring will be indicative of similar changes in the SNM of the memory cells in the memory array due to various aging mechanisms.

The embodiments 100 and 200 of the SNM monitoring circuit can further comprise additional components that allow the SNM of the test memory cell 10 to be repeatedly monitored and, more specifically, to be monitored periodically and continuously in both read and hold modes.

Specifically, in one embodiment 100, as shown in FIG. 1, the SNM monitoring circuit can further comprise at least the following components: a clock signal generator 160; a voltage waveform generator 120; a reference voltage generator 180; first and second voltage comparators 131, 132; first and second logic gates 151, 152 (e.g., AND gates); first and second sample and hold devices 141, 142; and a voltmeter 150.

The clock signal generator 160 can generate (i.e., can be adapted to generate, configured to generate, etc.) a clock signal 165 (e.g., in the form of a square wave with a 50% duty cycle and a fixed, constant frequency). Such clock signal generators are well known in the art and, thus, the details are omitted from this specification in order to allow the reader to focus on the salient aspects of the disclosed embodiments.

Figure 4A:
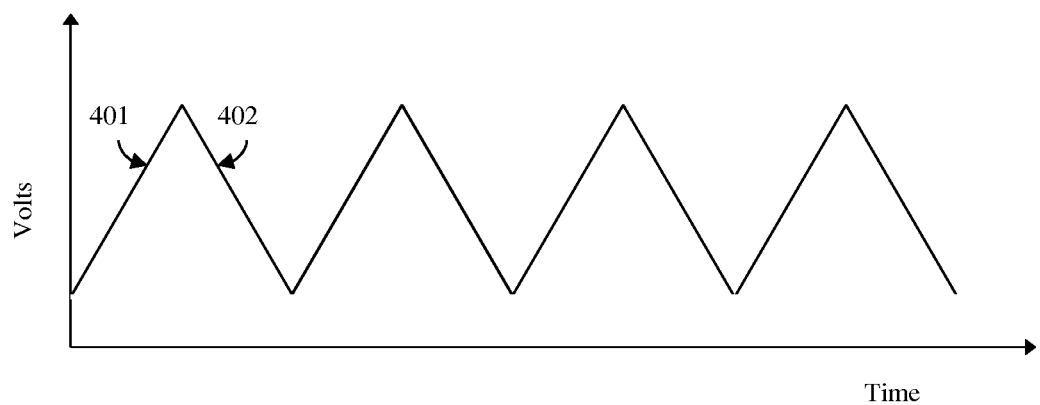
FIG. 4A is a graph illustrating an exemplary triangular voltage waveform.
Figure 4B:
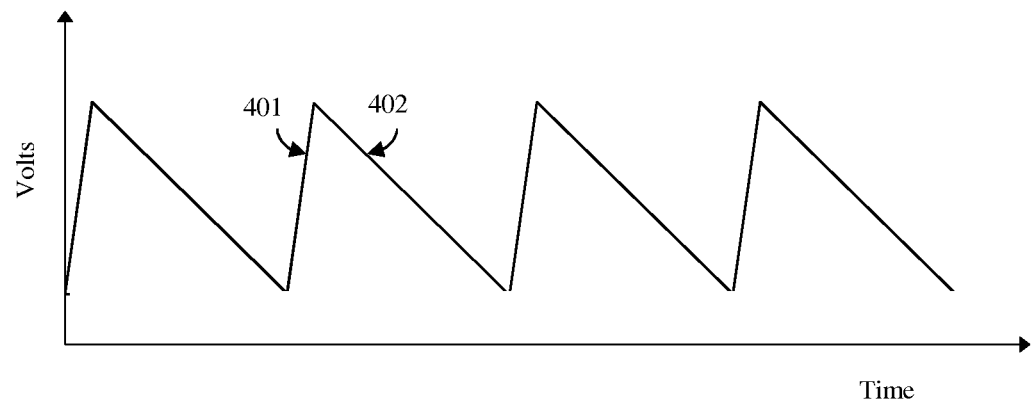
FIG. 4B is a graph illustrating an exemplary sawtooth voltage waveform.

The voltage waveform generator 120 can receive the clock signal 165 and can generate (i.e., can be adapted to generate, configured to generate, etc.) a voltage waveform 125, based on the clock signal 165. Specifically, the voltage waveform generator 120 can generate a voltage waveform 125, such as a triangular voltage waveform or a sawtooth voltage waveform, having linear rising and falling edges (also referred to herein as linear rising and falling cycles). That is, in the voltage waveform 125, the voltage increases and then decreases linearly overtime with each wave. Those skilled in the art will recognize that a triangular voltage waveform is generally understood to be a voltage waveform with symmetrical rising and falling edges 401 and 402 (as shown in FIG. 4A) and a sawtooth waveform is generally understood to be a voltage waveform with a fast (i.e., steep) rising edge 401 and slow (i.e., gradual) falling edge 402 (as shown in FIG. 4B) or vice versa. Such voltage waveform generators are well known in the art and, thus, the details are omitted from this specification in order to allow the reader to focus on the salient aspects of the disclosed embodiments. The voltage waveform generator 120 can further be electrically connected to the first node 11 of the test memory cell 10 and can apply the voltage waveform 125 to that first node 11.

The reference voltage generator 180 can generate (i.e., can be adapted to generate, configured to generate, etc.) a reference voltage 185 and, particularly, a relatively high and constant reference voltage (e.g., a reference voltage that is 0.75-0.9 times the power supply voltage (Vdd)). Reference voltage generators capable of generating relatively high, constant, reference voltages are well known in the art and, thus, the details are omitted from this specification in order to allow the reader to focus on the salient aspects of the disclosed embodiments.

The first voltage comparator 131 can be electrically connected to and can receive inputs from the first node 11 of the test memory cell 10 and the reference voltage generator 180.

The first logic gate 151 can be electrically connected to and can receive an input from the first voltage comparator 131. The first sample and hold device 141 can be triggered to operate by the first logic gate 151 and can be electrically connected between the second node 12 of the test memory cell 10 and the voltmeter 150.

In operation, the first voltage comparator 131 can compare (i.e., can be adapted to compare, can be configured to compare, etc.) the input voltage 113 at the first node 11 to the reference voltage 185. When the input voltage 113 is above the high reference voltage 185 during the falling edge of the voltage waveform 125 (i.e., as the falling edge of the waveform is applied to the first node 11), the first voltage comparator 131 can output a first comparator output signal 133 having a low value (e.g., a "0" value). However, at a first point in time, when the input voltage 113 at the first node falls below the high reference voltage 185 during the same falling edge of the voltage waveform 125, the first comparator output signal 133 can switch to a high value (e.g., a "1" value). The first logic gate 151 can receive the first comparator output signal 133 and can also receive an activation signal 167.

It should be noted that the activation signal 167 can be received from an activation switch (not shown), can be based on the clock signal 165 from the clock signal generator 160, can have a low value (e.g., a "0" value) when the voltage waveform 125 is on the rising edge and a high value (e.g., a "1" value) when the voltage waveform 125 is on the falling edge.

The first logic gate 151 can comprise a first AND gate such that it outputs a first logic gate output signal 153 with a high value (e.g., a "1" value) to trigger operation of the first sample and hold device 141 only when both the first comparator output signal 133 and the activation signal 167 have high values. In other words, operation of the first sample and hold device 141 can only be triggered at a first point in time during the falling edge of the voltage waveform 125 when the input voltage 113 at the first node 11 falls below the high reference voltage 185. Once operation of the first sample and hold device 141 is triggered, the first sample and hold device 141 can capture (i.e., can be adapted to capture, configured to capture, etc.) and, more particularly, can sample and hold the output voltage 114 of the test memory cell 10 at the second node 12.

Additionally, the second voltage comparator 132 can be electrically connected to and can receive inputs from the second node 11 of the test memory cell 10 and the reference voltage generator 180. The second logic gate 152 can be electrically connected to and can receive an input from the second voltage comparator 132. The second sample and hold device 142 can be triggered to operate by the second logic gate 152 and can be electrically connected between the first node 11 of the test memory cell 10 and the voltmeter 150.

In operation, the second voltage comparator 132 can compare (i.e., can be adapted to compare, can be configured to compare, etc.) the output voltage 114 at the second node 12 to the reference voltage 185. When the output voltage 114 is below the high reference voltage 185 during the falling edge of the voltage waveform 125 (i.e., as the falling edge of the voltage waveform is applied to the first node 11), the second voltage comparator 132 can output a second comparator output signal 134 having a low value (e.g., a "0" value). However, at a second point in time during the same falling edge, when the output voltage 114 rises above the reference voltage 185, the second comparator output signal 134 can switch to a high value (e.g., a "1" value). The second logic gate 152 can receive the second comparator output signal 134 and can also receive the activation signal 167. As discussed above, the activation signal 167 can be received from an activation switch (not shown), can be based on the clock signal 165 from the clock signal generator 160, can have a low value (e.g., a "0" value) when the voltage waveform 125 is on the rising edge and a high value (e.g., a "1" value) when the voltage waveform is on the falling edge. The second logic gate 152 can comprise a second AND gate such that it outputs second logic gate output signal 154 with a high value (e.g., a "1" value) to trigger operation of the second sample and hold device 142 only when both the second comparator output signal 134 and the activation signal 167 have high values. In other words, operation of the second sample and hold device 142 can only be triggered at a second point in time during the falling edge of the voltage waveform 125 when the output voltage 114 at the second node 12 rises above the high reference voltage 185. Once operation of the second sample and hold device 142 is triggered, the second sample and hold device 142 can capture (i.e., can be adapted to capture, configured to capture, etc.) and, more particularly, can sample and hold the input voltage 113 at the first node 11 of the test memory cell 10.

It should be noted that sample and hold devices capable of capturing (i.e., sampling and holding) a voltage value of a node at a particular point in time are well known in the art and, thus, the details are omitted from this specification in order to allow the reader to focus on the salient aspects of the disclosed embodiments.

The output voltage 114 of the test memory cell 10 at the second node 12, as captured (i.e., sampled and held) by the first sample and hold device 141 at the first point in time when the input voltage 113 at the first node 11 drops below the high reference voltage 185, and the input voltage 113 of the test memory cell 10 at the first node 11, as captured (i.e., sampled and held) by the second sample and hold device 142 at the second point in time when the output voltage 114 rises above the high reference voltage 185, can be received as inputs by the voltmeter 150. Then, the voltmeter 150 can determine (i.e., can be adapted to determine, configured to determine, etc.) the difference between these two captured voltages and this difference will be proportional to the SNM of the test memory cell 10.

Figure 5A:
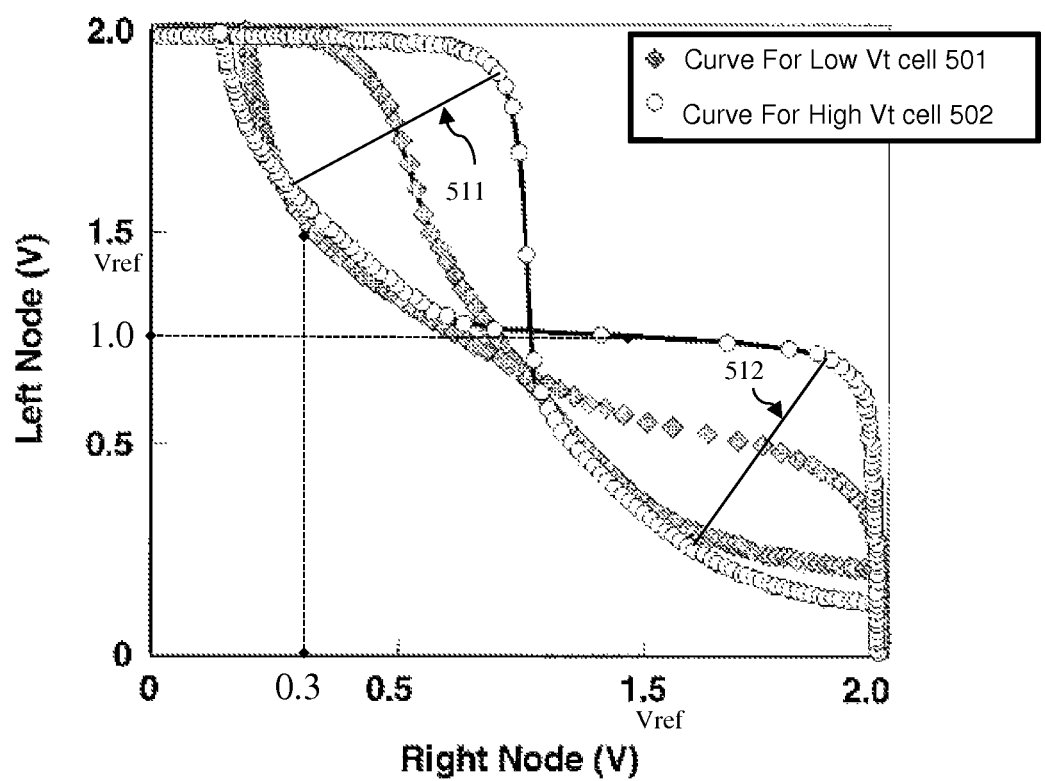
FIG. 5A is a graph illustrating exemplary butterfly curves (i.e., voltage transfer curves) for SRAM cells.

More specifically, FIG. 5A is a graph illustrating exemplary butterfly curves (i.e., voltage transfer curves) for high and low threshold voltage test SRAM cells. In the graph, the butterfly curve (i.e., voltage transfer curve) with solid diamonds represents a low threshold voltage (e.g., approximately 300 mV threshold voltage) test SRAM cell 501 and the butterfly curve with open circles represents a high threshold voltage (e.g., approximately 700 mV threshold voltage) test SRAM cell 502. Voltage transfer refers to the impact on the voltage at one internal node of the SRAM cell (e.g., the second node 12, also referred to as the right node) as a function of the change in voltage applied to the other internal node (e.g., the first node 11, also referred to as the left node) and vice versa. With an SRAM cell (e.g., cell 502), the static noise margin (SNM) is typically defined as the longest vector (e.g., see SNM vector 511) between the upward sweep and the downward sweep of the butterfly curve. Thus, for example as shown FIG. 5A, when the high reference voltage (Vref) is ¾ the cell power supply voltage (Vdd) (e.g., 1.5V), then the second node 12 will be at 0.3V when the first node 11 drops below the reference voltage and the first node 11 will be at 1.0V when the second node 12 rises above the reference voltage. The difference between these two voltage amounts (i.e., 1.0V−0.3V=0.7V) is proportional to the SNM of the test SRAM cell 502 as represented by the SNM vector 511. That is, if the SNM vector 511 decreases so will the difference between the two measured voltage amounts (i.e., 1.0V–0.3V=0.7V) and vice versa.

Figure 5B:
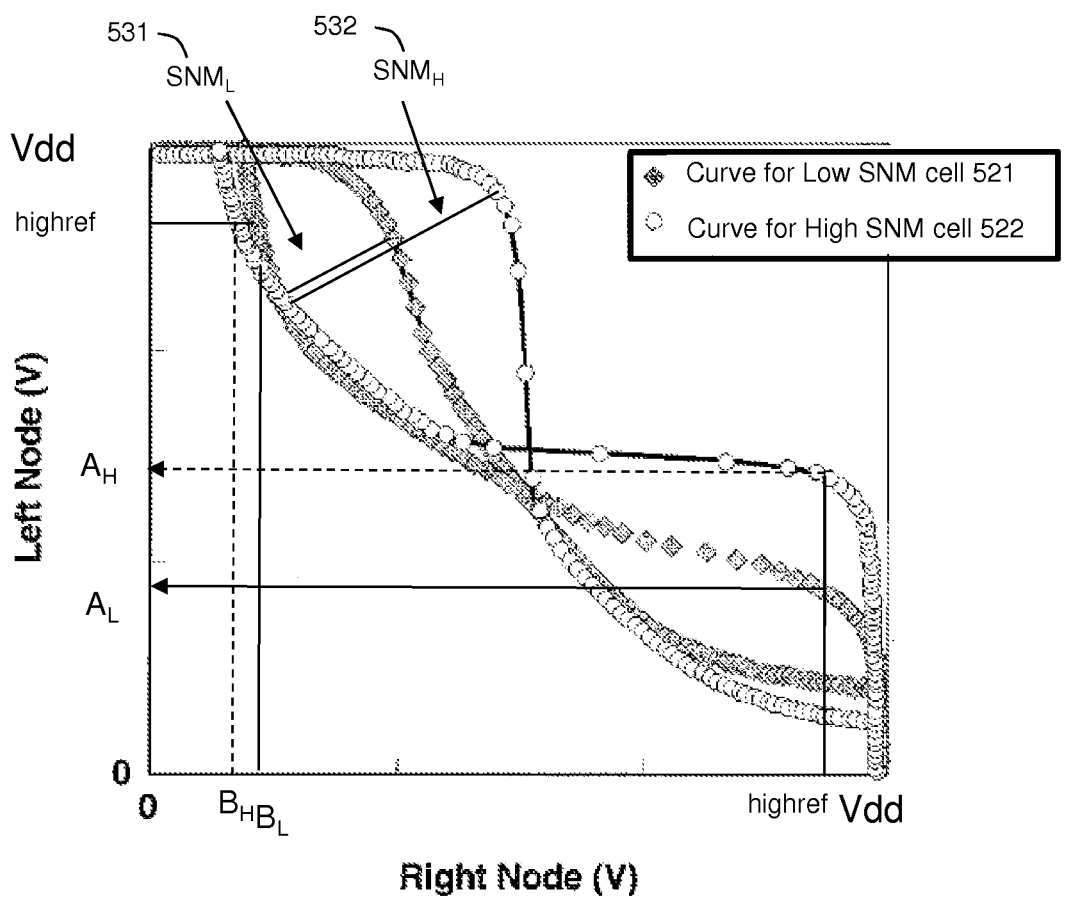
FIG. 5B is another graph illustrating exemplary butterfly curves for SRAM cells.

More specifically, the measured signal tracks with the conventionally defined SNM consult. Referring to FIG. 5B in combination with FIG. 1, FIG. 5B similarly shows two different butterfly curves that represent two memory cells 521, 522, having the same design but different SNMs ($SNM_H$ 531 and $SNM_L$ 532, respectively). The different SNMs 531, 532 may be exhibited for any number of reasons, for example, aging, process differences, environmental differences, a difference in applied voltage, etc. For a reference voltage, which is shown in FIG. 5B, as a fraction of Vdd, $B_H$ represents the signal 114 for the cell 522 with the high SNM 532, as captured at the second node 12 by the first sample and hold device 141 at the first point in time when the input voltage 113 at the first node 11 drops below the high reference voltage 185, whereas $B_L$ represents this same signal 114 for the cell 521 with the low SNM 531. Furthermore, $A_H$ represents the signal 113 for the cell 522 with the high SNM 532, as captured at the first node 12 by the second sample and hold device 142 at the second point in time when the output voltage 114 rises above the high reference voltage 185, whereas $A_L$ represents this same signal 113 for the cell 521 with the low SNM 531. As shown, the difference between the signals $A_H$ and $B_H$, when compared to the difference between $A_L$ and $B_L$, tracks directly and monotonically with the conventionally defined SNM.

Consequently, any changes in this difference as noted with repeated monitoring over time and, particularly, with periodic and continuous monitoring over time (e.g., with each falling edge of the voltage waveform) will be indicative of corresponding changes in the SNM of the test memory cell 10 due to various aging mechanisms. Furthermore, changes in the SNM of the test memory cell 10 due to various aging mechanism will be indicative of corresponding changes in the SNM of the memory cells in the memory array, which are subject to the same aging mechanisms. Thus, based on the monitoring results, preemptive action (e.g., adjusting the power supply voltage (Vdd) to the memory cells in the memory array) can be taken to prevent memory cell stability fails.

It should be noted that during the rising edge of the voltage waveform 125 (i.e., as the rising edge of the voltage waveform 125 is applied to the first node 11 of the test memory cell 10), the first and second sample and hold devices 141 and 142 can be disabled by the first and second logic gates 151, 152, respectively, as discussed above. Furthermore, the first and second comparators 131, 132 can be reset by a reset signal 166 generated based on the clock signal 165 from the clock signal generator 160.

Another embodiment 200 of a SNM monitoring circuit, as shown in FIG. 2, can comprise at least the following components: a clock signal generator 260; a voltage waveform generator 220; a first and second reference voltage generators 280, 290; a voltage comparator 232; a logic gate 252 (e.g., an AND gate); a sample and hold device 242; and a voltmeter 250.

As in the previously described embodiment, the clock signal generator 260 can generate (i.e., can be adapted to generate, configured to generate, etc.) a clock signal 265 (e.g., in the form of a square wave with a 50% duty cycle and a fixed, constant frequency). Such clock signal generators are well known in the art and, thus, the details are omitted from this specification in order to allow the reader to focus on the salient aspects of the disclosed embodiments.

Also as in the previously described embodiment, the voltage waveform generator 220 can receive the clock signal 265 and can generate (i.e., can be adapted to generate, configured to generate, etc.) a voltage waveform 225, based on the clock signal 265. Specifically, the voltage waveform generator 220 can generate a voltage waveform 225, such as a triangular voltage waveform or a sawtooth voltage waveform, having linear rising and falling edges (also referred to herein as linear rising and falling cycles)(see detailed discussion regarding FIGS. 4A and 4B above). Such voltage waveform generators are well known in the art and, thus, the details are omitted from this specification in order to allow the reader to focus on the salient aspects of the disclosed embodiments. The voltage waveform generator 220 can further be electrically connected to the first node 11 of the test memory cell 10 and can apply the voltage waveform 225 to that first node 11.

The first reference voltage generator 280 can generate (i.e., can be adapted to generate, configured to generate, etc.) a reference voltage 285 and, particularly, a relatively high and constant reference voltage (e.g., a reference voltage that is 0.75-0.9 times the power supply voltage (Vdd)). Reference voltage generators capable of generating relatively high, constant, reference voltages are well known in the art and, thus, the details are omitted from this specification in order to allow the reader to focus on the salient aspects of the disclosed embodiments.

The second reference voltage generator 290 can generate a second reference voltage and, particularly, a relatively low reference voltage (e.g., a reference voltage that is lower than the first reference voltage).

The second reference voltage generator 290 can generate (i.e., can be adapted to generate, configured to generate, etc.) a relatively low and constant reference voltage (e.g., a reference voltage that is 0.10-0.25 times the power supply voltage (Vdd)). Reference voltage generators capable of generating relatively low, constant, reference voltages are well known in the art and, thus, the details are omitted from this specification in order to allow the reader to focus on the salient aspects of the disclosed embodiments.

Figure 6:
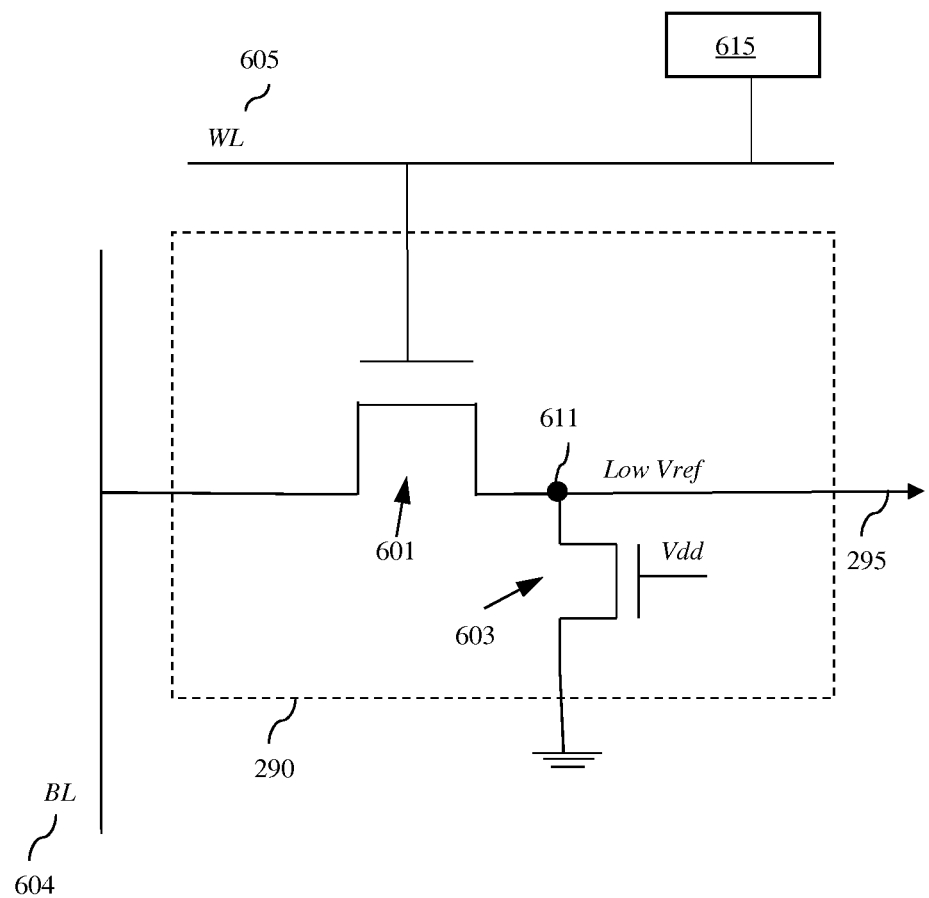
FIG. 6 is a schematic diagram illustrating variable reference voltage generator that can be incorporated into the SNM monitoring circuit of FIG. 2.

Alternatively, the second reference voltage generator 290 can comprise a variable reference voltage generator, as shown in FIG. 6, that generates (i.e., that is adapted to generate, configured to generate, etc.) a variable low reference voltage. This variable low reference voltage can track the voltage on the test memory cell 10 in order to ensure that the low reference voltage is always higher than the lowest output voltage at the second node 12. More specifically, the lower peaks of the voltage waveform 225 generated by the voltage waveform generator 220 may not extend all the way to ground. Therefore, a constant low reference voltage (e.g., set at 0.1-0.25 times the power supply voltage (Vdd)) might not be sufficient because such a constant low reference voltage may actually be lower that the lowest output voltage at the second node 12, particularly, when the test memory cell is operating in the read mode. It should be noted that the relevant low reference voltage is determined by the voltage divider operation between the transfer gate (for example, pass-gate transistor 1a in FIG. 3) and the pull-down (for example, pull-down transistor 3a in FIG. 3), and may not always track conveniently as some fraction of the power supply voltage. In order to ensure that the low reference voltage is always higher than the lowest output voltage at the second node, a variable low reference voltage generator, as shown in FIG. 6, can be incorporated into the SNM memory circuit.

This variable low reference voltage generator can comprise an additional pass-gate transistor 601 connected in series at an additional node 611 to an additional pull-down transistor 603. The additional pass-gate transistor 601 can comprise, for example, N-type field effect transistor that is essentially identical to the pass-gate transistors 1a, 1b of the test memory cell 10, as shown in FIG. 3 and described in detail above. The additional pull-down transistor 603 can comprise, for example, an N-type field effect transistor that is smaller (e.g., 5-10% smaller) than the pull-down transistors 3a, 3b of the test memory cell 10. The source of the additional pass-gate transistor 601 can be connected to a bitline 604 and the drain of the additional pull-down transistor 603 can be connected to ground. The gate of the additional pass-gate transistor can be connected to a wordline (WL) 605 via a switch 615, which selectively controls (i.e., can be adapted to selectively control, configured to selectively control, etc.) the low reference voltage generator and, particularly, the electrical connection between the wordline 605 and the gate of the additional pass-gate transistor 601 so as to allow the low reference voltage generator to operate in the same modes as the test memory cell 10: (1) a hold mode (also referred to as standby mode) and (2) read mode.

In operation, the voltage (i.e., the potential) on the additional node 611 will be output as the low reference voltage 295 and this low reference voltage will vary depending upon whether the low reference voltage generator is operating in the hold mode or the read mode. Specifically, in the hold mode, the switch 615 will ensure that the wordline 605 is not electrically connected to the gate of the additional pass-gate transistor 601 and, thus, that the additional node 611 will not be not electrically connected to the bitline 604. In the read mode, the bitline 604 is pre-charged high (e.g., to the supply voltage (Vdd)) and the switch 615 will ensure that the wordline 605 is electrically connected to the gate of the additional pass-gate transistor 601, thereby enabling the additional pass-gate transistor 601 in order to electrically connect the bitline 604 to the additional node 611. The gate of the additional pull-down transistor 603 is connected to Vdd and, thus, in either case this pull-down transistor 603 pulls down the potential of the additional node 611 toward ground. However, the low reference voltage on the additional node 611 will be higher when in the read mode than in the hold mode as a function of the connection to the pre-charged bitline 604. Furthermore, since the additional pull-down transistor 603 is slightly smaller (e.g., 5-15% smaller) than the pull-down transistors 1a, 1b of the test memory cell 10, the low reference voltage on additional node 611 will always be slightly larger than the node 12 of the test memory cell 10.

Additionally, referring again to FIG. 2, the voltage comparator 232 can be electrically connected to and can receive inputs from the second node 11 of the test memory cell 10 and the first reference voltage generator 280. The logic gate 252 can be electrically connected to and can receive an input from the voltage comparator 232. The sample and hold device 242 can be triggered to operate by the logic gate 252 and can be electrically connected between the first node 11 of the test memory cell 10 and the voltmeter 250.

In operation, the voltage comparator 232 can compare (i.e., can be adapted to compare, can be configured to compare, etc.) the output voltage 214 at the second node 12 to the first reference voltage 285 (i.e., the high reference voltage). When the output voltage 214 is below the first reference voltage 285 (i.e., the high reference voltage) during the falling edge of the voltage waveform 225 (i.e., as the falling edge of the voltage waveform is applied to the input node 11), the voltage comparator 232 can output a comparator output signal 234 having a low value (e.g., a "0" value). However, at a point in time, when the output voltage 214 rises above the high reference voltage 285 during the same falling edge, the comparator output signal 234 can switch to a high value (e.g., a "1" value). The logic gate 252 can receive the comparator output signal 234 and can also receive an activation signal 267. As discussed above with regard to the previous embodiment, the activation signal 267 can be received from an activation switch (not shown), can be based on the clock signal 265 from the clock signal generator 260, can have a low value (e.g., a "0" value) when the voltage waveform 225 is on the rising edge and a high value (e.g., a "1" value) when the voltage waveform is on the falling edge. The logic gate 252 can comprise a second AND gate such that it outputs logic gate output signal 254 with a high value (e.g., a "1" value) to trigger operation of the sample and hold device 242 only when both the comparator output signal 234 and the activation signal 267 have high values. In other words, operation of the sample and hold device 242 can only be triggered at a point in time during the falling edge of the voltage waveform 225 when the output voltage 214 at the second node 12 rises above the high reference voltage 285. Once operation of the sample and hold device 242 is triggered, the sample and hold device 242 can capture (i.e., can be adapted to capture, configured to capture, etc.) and, more particularly, can sample and hold the input voltage 213 of the test memory cell 10 at the first node 11.

It should be noted that sample and hold devices capable of capturing (i.e., sampling and holding) a voltage value of a node at a particular point in time are well known in the art and, thus, the details are omitted from this specification in order to allow the reader to focus on the salient aspects of the disclosed embodiments.

The second reference voltage 295 (i.e., the low reference voltage) and the input voltage 213 of the test memory cell 10 at the first node 11, as captured (i.e., as sampled and held) by the sample and hold device 242 at the point in time when the output voltage 214 rises above the high reference voltage 285, can be received as inputs by the voltmeter 250. Then, the voltmeter 250 can determine (i.e., can be adapted to determine, configured to determine, etc.) the difference between the low reference voltage 295 and the captured voltage. As in the previously described embodiment 100, this difference as measured by the voltmeter 250 will be proportional to the SNM of the test memory cell 10.

Consequently, any changes in this difference as noted with repeated monitoring over time and, particularly, with periodic and continuous monitoring over time (e.g., with each falling edge of the voltage waveform) will be indicative of corresponding changes in the SNM of the test memory cell 10 due to various aging mechanisms. Furthermore, changes in the SNM of the test memory cell 10 due to various aging mechanism will be indicative of corresponding changes in the SNM of the memory cells in the memory array, which are subject to the same aging mechanisms. Thus, based on the monitoring results, preemptive action (e.g., adjusting the power supply voltage (Vdd) to the memory cells in the memory array) can be taken to prevent memory cell stability fails.

It should be noted that, during the rising edge of the voltage waveform 225 (i.e., as the rising edge of the voltage waveform 225 is applied to the first node 11 of the test memory cell 10), the sample and hold device 242 can be disabled by the logic gate 252, as discussed above. Furthermore, the comparator 232 can be reset by a reset signal 266 generated based on the clock signal 265 from the clock signal generator 260.

It should further be noted that, as illustrated in FIG. 5A, a SNM vector is defined for both the upper half (see SNM vector 511) and the lower half (see SNM vector 502) of an SRAM butterfly curve (see curve for cell 502) and by design these SNM vectors 511 and 512 should ideally be identical. However, such SNM vectors 511, 512 will typically vary in size because the transistors within the cross-coupled inverter of the test memory cell will vary due to manufacturing process variations and/or various aging mechanisms. Furthermore, those skilled in the art will recognize that, although the test memory cell and each SRAM cell in the memory array will have the same design, their respective butterfly curves and the SNM vectors thereof will similarly vary due to manufacturing process variations and/or various aging mechanisms. Consequently, rather monitoring the SNM of a single test memory cell, the above-described embodiments 100 and 200 of the SNM monitoring circuit can incorporate a plurality of test memory cells 10 connected in parallel at the first and second nodes 11, 12 as opposed to a single test memory cell 10 so that the resulting difference determined by the voltmeter represents a more accurate average difference and, thereby so that the SNM monitoring circuit is more robust.

Figure 7A:
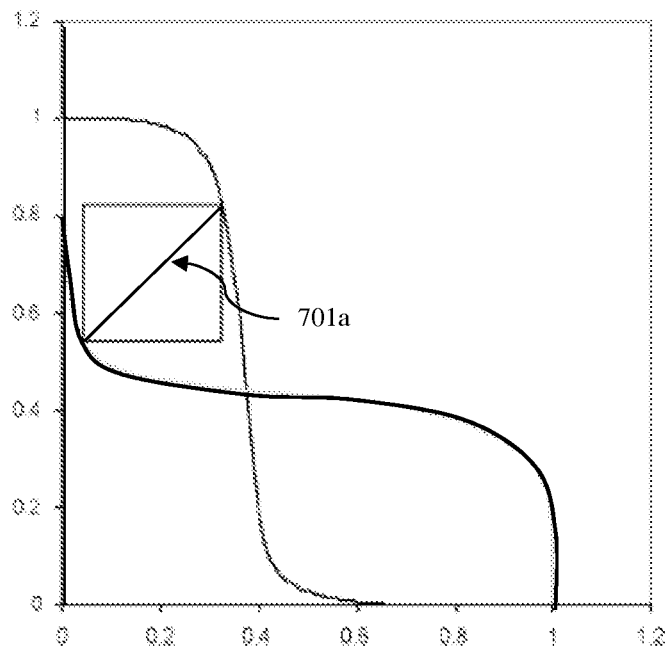
FIG. 7A is a graph illustrating an exemplary butterfly curve for a static random access memory (SRAM) cell operating in a hold mode.
Figure 7B:
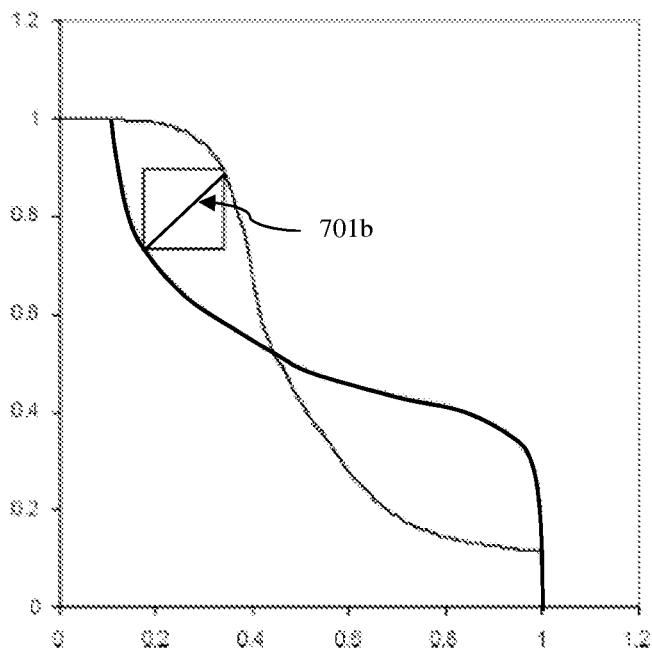
FIG. 7B is a graph illustrating an exemplary butterfly curve for the same static random access memory (SRAM) operating in a read mode.

Finally, it should be noted that one significant advantage of the present SNM monitoring circuit embodiments 100 and 200 over prior art techniques used to monitor the SNM of SRAM cells in an SRAM array is that monitoring can be conducted in both the hold and read modes. Specifically, those skilled in the art will recognize that the static noise margin (SNM) of a static random access memory (SRAM) cell is different when the cell is operating in a hold mode (see SNM vector 701a of FIG. 7A) as compared to when the cell is operating in a read mode (see SNM vector 701b of FIG. 7B). In the hold mode, pass-gate transistors are not activated and, thus, there is no electrical connection between the bitlines and the internal nodes of the memory cell. As a result, the amount of voltage noise required to flip the stored value of the cell when the cell is in the hold mode is relatively high (i.e., the SNM is relatively high). Contrarily, in the read mode, the pass-gate transistors are activated and, thus, there is an electrical connection between bitlines and the internal nodes of the memory cell. As a result, the amount of voltage noise required to flip the stored value of the cell when the cell is in the read mode is relatively low (i.e., the SNM is relatively low). Since the embodiments disclosed herein allow for SNM monitoring in both hold and read modes, any decision to take preemptive action (e.g., to change the supply voltage to the memory cells of the memory array) to avoid memory cell stability fails can be made based on how such a change would impact the performance of the memory cells within the memory array when operating in either of the modes.

Figure 8:
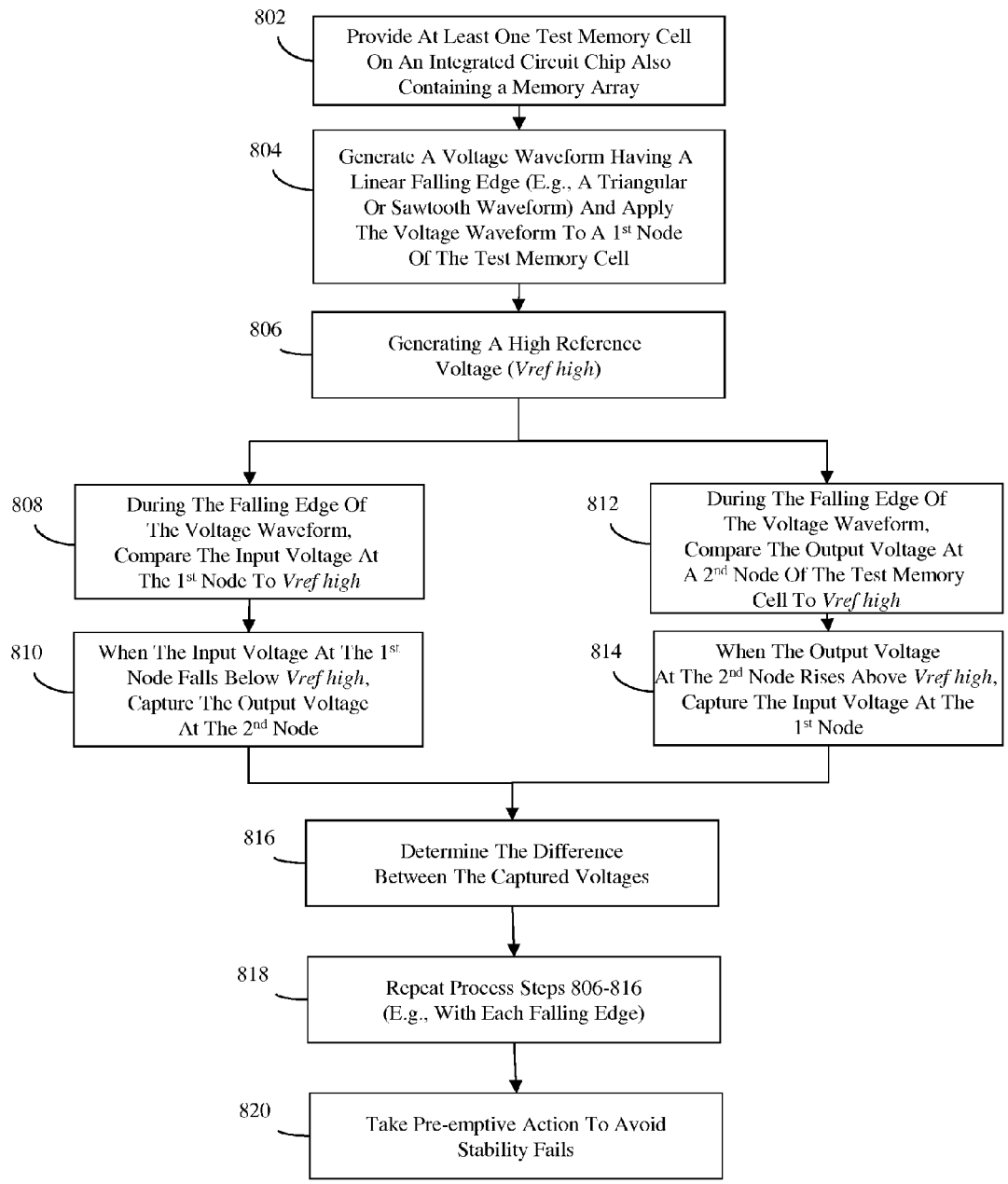
FIG. 8 is a flow diagram illustrating an embodiment of a method for monitoring the static noise margin (SNM) of memory cells in a memory array.
Figure 9:
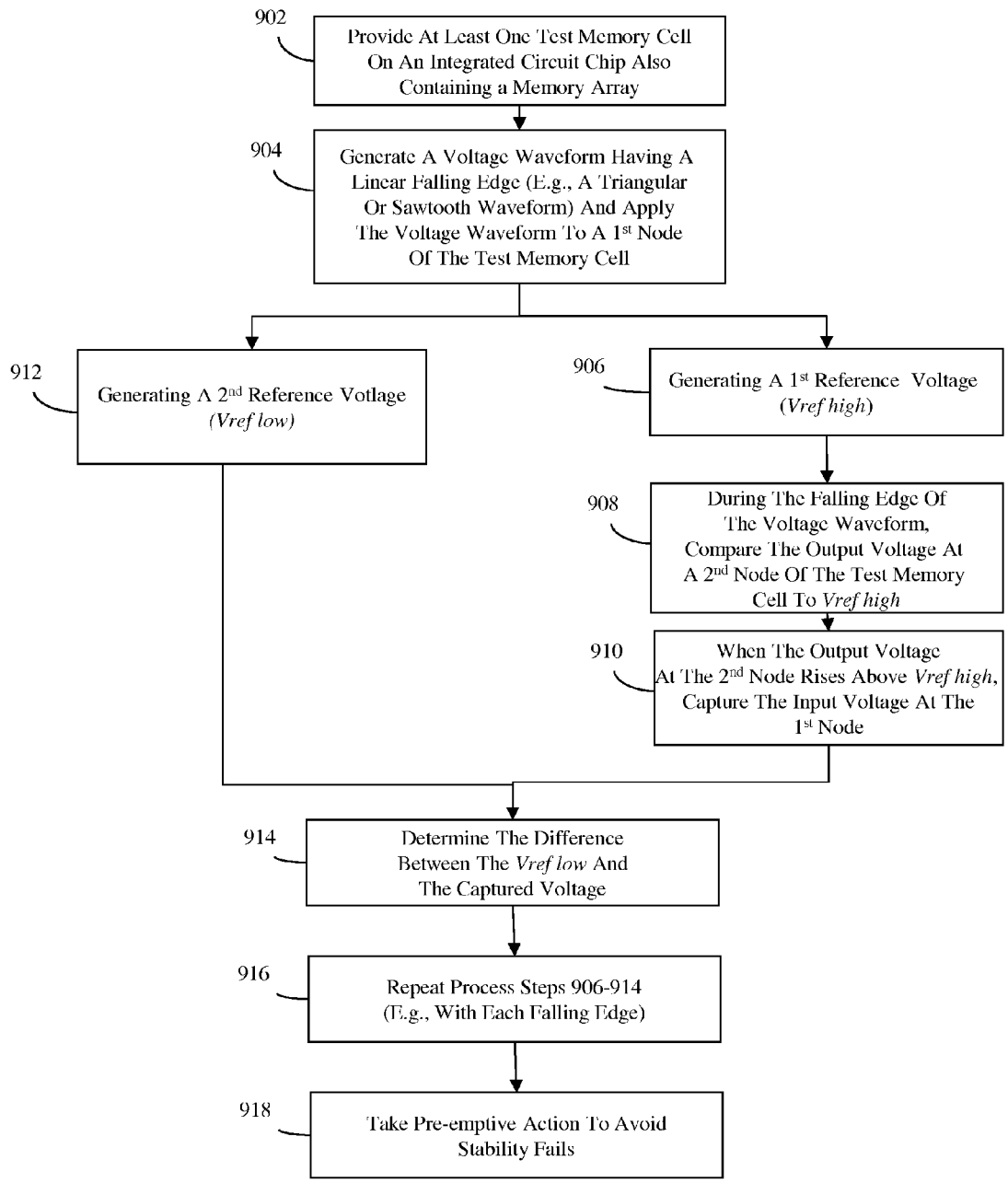
FIG. 9 is a flow diagram illustrating another embodiment of a method for monitoring the static noise margin (SNM) of memory cells in a memory array.

Referring to FIGS. 8 and 9 in combinations with FIGS. 1 and 2, respectively, also disclosed herein are embodiments of a static noise margin (SNM) monitoring method. Each of the method embodiments can comprise providing at least one test memory cell 10 on an integrated circuit chip, which also comprises a memory array comprising a plurality of memory cells (e.g., an SRAM array comprising a plurality of SRAM cells) (802 or 902). The test memory cell 10 can, for example, comprise a six-transistor (6T) SRAM cell such as that shown in FIG. 3 and described in detail above.

The method embodiments can further comprise generating a voltage waveform 125, 225 and applying this voltage waveform 125, 225 to a first node 11 of the test memory cell 10 (804 or 904). The voltage waveform 125, 225 can be generated based on a clock signal 165, 265 such that it has a linear falling edge. Those skilled in the art will recognize that triangular and sawtooth voltage waveforms each have linear rising and falling edges (also referred to as rising and falling cycles) and, thus, would be suitable voltage waveforms for purposes herein. A triangular voltage waveform is generally understood to be a voltage waveform with symmetrical rising and falling edges 401 and 402 (as shown in FIG. 4A) and a sawtooth waveform is generally understood to be a voltage waveform with a fast (i.e., steep) rising edge 401 and slow (i.e., gradual) falling edge 402 (as shown in FIG. 4B) or vice versa.

Referring specifically to FIG. 8 in combination with FIG. 1, in one embodiment, the SNM monitoring method can further comprise generating (e.g., by a reference voltage generator 180) a reference voltage 185 and, particularly, a relatively high and constant reference voltage (e.g., a reference voltage that is 0.75-0.9 times the power supply voltage (Vdd)) (806).

During the falling edge only of the voltage waveform 125 (i.e., as the falling edge of the voltage waveform 125 is applied to the first node 11), the input voltage 113 at that first node 11 can be compared (e.g., by a first voltage comparator 131) to the high reference voltage 185 (808). At a first point in time when the input voltage 113 at the first node 11 falls below the high reference voltage 185, the output voltage 114 of the test memory cell 10 at a second node 12 can be captured (i.e., sampled and held), for example, by a first sample and hold device 141 (810).

Additionally, during the same falling edge of the voltage waveform 125 (i.e., as the falling edge of the voltage waveform is applied to the first node 11), the output voltage 114 at the second node 12 of the test memory cell 10 can be compared (e.g., by a second voltage comparator 132) to the high reference voltage 185 (812). Then, at a second point in time when the output voltage 114 at the second node 12 rises above the high reference voltage 185, the input voltage 113 at the first node 11 can be captured (i.e., sampled and held), for example, by a second sample and hold device 142 (814).

Then, the difference between the output voltage 114, as captured at process 810, and the input voltage 113, as captured at process 814, can be determined (e.g., by a voltmeter 150) (816). This difference will be proportional to the SNM of the test memory cell 10. This difference can be repeatedly determined by repeating process steps 808-816 periodically and continuously (e.g., with each falling edge of the voltage waveform) (818). Since the difference is proportional to the SNM of the test memory cell, any changes in this difference as noted with repeated monitoring over time and, particularly, with periodic and continuous monitoring over time will be indicative of corresponding changes in the SNM of the test memory cell 10 due to various aging mechanisms. Furthermore, changes in the SNM of the test memory cell 10 due to various aging mechanism will be indicative of corresponding changes in the SNM of the memory cells in the memory array, which are subject to the same aging mechanisms. Thus, based on the monitoring results, preemptive action (e.g., adjusting the power supply voltage (Vdd) to the memory cells in the memory array) can be taken to prevent stability fails (820).

Referring specifically to FIG. 9 in combination with FIG. 2, in another embodiment, the SNM monitoring method can further comprise generating (e.g., by a first reference voltage generator 280) a first reference voltage 285 and, particularly, a relatively high reference voltage (e.g., a reference voltage that is 0.75-0.9 times the power supply voltage (Vdd)) (906).

Additionally, a second reference voltage 295 and, particularly, a relatively low reference voltage (e.g., a reference voltage that is lower than the first reference voltage 285) can also be generated (e.g., by a second reference voltage generator 290) (912). Specifically, at process 912 a constant low reference voltage can be generated, which is, for example, 0.10-0.25 times the power supply voltage (Vdd)). Alternatively, at process 912 a variable low reference voltage can be generated (e.g., using the variable reference voltage generator shown in FIG. 6) in order to ensure that the low reference voltage 295 is always higher than the lowest output voltage 114 at the second node 12, regardless of whether the test memory cell is operating in a read mode or a hold mode (see detail discuss above with regard to FIG. 6).

In this embodiment, during the falling edge only of the voltage waveform 225 (i.e., as the falling edge of the voltage waveform is applied to the first node 11), the output voltage 214 at the second node 12 of the test memory cell 10 can be compared (e.g., by a voltage comparator 232) to the first reference voltage 285 (i.e., to the high reference voltage) (908). Then, at a point in time when the output voltage 214 at the second node 12 rises above the first reference voltage 285 (i.e., the high reference voltage), the input voltage 213 at the first node 11 can be captured (i.e., sampled and held), for example, by a sample and hold device 242 (910).

Then, the difference between the input voltage 113, as captured at process 910, and the second reference voltage 295 (i.e., the low reference voltage) can be determined (e.g., by a voltmeter 250) (914). This difference will be proportional to the SNM of the test memory cell 10. This difference can be repeatedly determined by repeating process steps 906-914 periodically and continuously (e.g., with each falling edge of the voltage waveform) (916). Since the difference is proportional to the SNM of the test memory cell, any changes in this difference as noted with repeated monitoring over time and, particularly, with periodic and continuous monitoring over time at process will be indicative of corresponding changes in the SNM of the test memory cell 10 due to various aging mechanisms. Furthermore, changes in the SNM of the test memory cell 10 due to various aging mechanism will be indicative of corresponding changes in the SNM of the memory cells in the memory array, which are subject to the same aging mechanisms. Thus, based on the monitoring results, preemptive action (e.g., adjusting the power supply voltage (Vdd) to the memory cells in the memory array) can be taken to prevent stability fails (918).

It should be noted that in each of the above-described method embodiments, during the rising edge of the voltage waveform (i.e., as the rising edge of the voltage waveform is applied to the first node 11 of the test memory cell 10), the sample and hold devices that capture the node voltages at processes 810 and 814 of FIG. 8 and process 910 of FIG. 9 can be disabled. Also, during the rising edge of the waveform, the voltage comparators that compare the node voltages to reference voltages at processes 808 and 812 of FIG. 8 and at process 910 of FIG. 9 can be reset by a reset signal.

It should further be noted that in each of the above-described method embodiments, rather than monitoring the SNM of a single test memory cell, the SNM of a plurality of test memory cells 10 connected in parallel at the first and second nodes 11, 12 can be monitored so that the resulting difference determined at process 816 of FIG. 8 and at process 914 of FIG. 9 represents a more accurate average difference and, thereby so that the SNM monitoring method is more robust.

Finally, it should be noted that one significant advantage of the present SNM monitoring method over prior art techniques used to monitor the SNM of SRAM cells in an SRAM array is that monitoring can be conducted in both the hold and read modes. Specifically, those skilled in the art will recognize that the static noise margin (SNM) of a static random access memory (SRAM) cell is different when the cell is operating in a hold mode (see SNM vector 701a of FIG. 7A) as compared to when the cell is operating in a read mode (see SNM vector 701b of FIG. 7B). In the hold mode, pass-gate transistors are not activated and, thus, there is no electrical connection between the bitlines and the internal nodes of the memory cell. As a result, the amount of voltage noise required to flip the stored value of the cell when the cell is in the hold mode is relatively high (i.e., the SNM is relatively high). Contrarily, in the read mode, the pass-gate transistors are activated and, thus, there is an electrical connection between bitlines and the internal nodes of the memory cell. As a result, the amount of voltage noise required to flip the stored value of the cell when the cell is in the read mode is relatively low (i.e., the SNM is relatively low). Since the disclosed method embodiments allow for SNM monitoring in both hold and read modes, any decision to take preemptive action at process 820 of FIG. 8 or at process 918 of FIG. 9 (e.g., to change the supply voltage to the memory cells of the memory array) can be made based on how such a change would impact the performance of the memory cells within the memory array when operating in either of the modes.

It should be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises", "comprising", "included", and/or "including", when used in this specification, specify the presence of stated features, integers, steps, operations, elements, and/or components, but do not preclude the presence or addition of one or more other features, integers, steps, operations, elements, components, and/or groups thereof. It should further be understood that corresponding structures, materials, acts, and equivalents of all means or step plus function elements in the claims below are intended to include any structure, material, or act for performing the function in combination with other claimed elements as specifically claimed. Finally, it should be understood that the above-description of the embodiments was presented for purposes of illustration and was not intended to be exhaustive or limiting. Many modifications and variations will be apparent to those of ordinary skill in the art without departing from the scope and spirit of the disclosed embodiments.

Therefore, disclosed above are embodiments of a static noise margin (SNM) monitoring circuit and method. In these embodiments, a voltage waveform having a linear falling edge can be generated (e.g., by a waveform generator) and applied to a first node of at least one test memory cell (e.g., a plurality of test memory cells connected in parallel). The input voltage at the first node can be captured (e.g., by a sample and hold device) at a point in time when the output voltage at a second node of the test memory cell(s) rises above a high reference voltage during the falling edge of the voltage waveform. Then, a voltage difference can be determined (e.g., by a voltmeter) between the input voltage, as captured, and either (1) the output voltage at the second node, as captured (e.g., by another sample and hold device) at an earlier point in time when the input voltage at the first node fell below the first reference voltage during the same falling edge, or (2) a low reference voltage. This difference will be proportional to the SNM of the test memory cell(s) such that any changes in this difference as noted with repeated monitoring will be indicative of corresponding changes in the SNM. Based on these changes, preemptive action can be taken to prevent memory cell stability fails.

What is claimed is:
1. A static noise margin monitoring circuit:
   at least one test memory cell comprising a first node and a second node;
   a waveform generator electrically connected to said first node, said waveform generator generating a voltage waveform having a linear falling edge and applying said voltage waveform to said first node;
a reference voltage generator generating a reference voltage;
a first sample and hold device capturing an output voltage at said second node at a first point in time when an input voltage at said first node falls below said reference voltage during said falling edge;
a second sample and hold device capturing said input voltage at said first node at a second point in time when said output voltage at said second node rises above said reference voltage during said falling edge; and
a voltmeter determining a difference between said output voltage, as captured by said first sample and hold device, and said input voltage, as captured by said second sample and hold device.

2. The static noise margin monitoring circuit of claim 1, said voltage waveform comprising any one of a sawtooth waveform and a triangular waveform.

3. The static noise margin monitoring circuit of claim 1, said difference being proportional to a static noise margin of said at least one test memory cell such that any changes in said difference noted with repeated monitoring are indicative of corresponding changes in said static noise margin.

4. The static noise margin monitoring circuit of claim 1, further comprising:
a first comparator comparing said input voltage at said first node to said reference voltage and causing said first sample and hold device to capture said output voltage at said second node when said input voltage falls below said reference voltage; and
a second comparator comparing said output voltage at said second node to said reference voltage and causing said second sample and hold device to capture said input voltage when said output voltage rises above said reference voltage.

5. The static noise margin monitoring circuit of claim 4, further comprising:
a first logic gate between said first comparator and said first sample and hold device; and
a second logic gate between said second comparator and said second sample and hold device,
said first logic gate and said second logic gate being controlled by a clock signal so as to selectively connect said first comparator to said first sample and hold device and said second comparator to said second sample and hold device, respectively, only during said falling edge.

6. The static noise margin monitoring circuit of claim 1, said test memory cell comprising a test static random access memory cell comprising:
a first inverter comprising a first pull-up transistor connected in series at said first node to said first pull-down transistor;
a first pass-gate transistor electrically connecting a first bitline and said first node;
a second inverter cross-coupled with said first inverter, said second inverter comprising a second pull-up transistor connected in series at said second node to a second pull-down transistor; and
a second pass-gate transistor electrically connecting a second bitline and said second node,
said first pass-gate transistor and said second pass-gate transistor being selectively controllable so as to allow operation of said test static random access memory cell in any one of a hold mode and a read mode.

7. The static noise margin monitoring circuit of claim 1, said reference voltage comprising 0.75-0.9 times a supply voltage for said test memory cell.

8. The static noise margin monitoring circuit of claim 1, further comprising a plurality of test memory cells connected in parallel.

9. A static noise margin monitoring circuit:
at least one test memory cell comprising a first node and a second node;
a waveform generator electrically connected to said first node, said waveform generator generating a voltage waveform having a linear falling edge and applying said voltage waveform to said first node;
a first reference voltage generator generating a first reference voltage;
a second reference voltage generator generating a second reference voltage lower than said first reference voltage;
a sample and hold device capturing said input voltage at said first node at a point in time when said output voltage at said second node rises above said first reference voltage during said falling edge; and
a voltmeter determining a difference between said input voltage, as captured by said sample and hold device, and said second reference voltage.

10. The static noise margin monitoring circuit of claim 9, said voltage waveform comprising any one of a sawtooth waveform and a triangular waveform.

11. The static noise margin monitoring circuit of claim 9, said difference being proportional to a static noise margin of said at least one test memory cell such that any changes in said difference noted with repeated monitoring are indicative of corresponding changes in said static noise margin.

12. The static noise margin monitoring circuit of claim 9, further comprising a comparator comparing said output voltage at said second node to said first reference voltage and causing said sample and hold device to capture said input voltage when said output voltage rises above said first reference voltage.

13. The static noise margin monitoring circuit of claim 12, further comprising a logic gate between said comparator and said sample and hold device, said logic gate being controlled by a clock signal so as to selectively connect said comparator to said sample and hold device only during said falling edge.

14. The static noise margin monitoring circuit of claim 9, said test memory cell comprising a test static random access memory cell comprising:
a first inverter comprising a first pull-up transistor connected in series at said first node to said first pull-down transistor;
a first pass-gate transistor electrically connecting a first bitline and said first node;
a second inverter cross-coupled with said first inverter, said second inverter comprising a second pull-up transistor connected in series at said second node to a second pull-down transistor; and
a second pass-gate transistor electrically connecting a second bitline and said second node,
said first pass-gate transistor and said second pass-gate transistor being selectively controllable so as to allow operation of said test static random access memory cell in any one of a hold mode and a read mode.

15. The static noise margin monitoring circuit of claim 14, said second reference voltage generator comprising a variable reference voltage generator.

16. The static noise margin monitoring circuit of claim 9, said first reference voltage comprising 0.75-0.9 times a supply voltage for said test memory cell.

17. The static noise margin monitoring circuit of claim 9, further comprising a plurality of test memory cells connected in parallel.

18. A static noise margin monitoring method comprising:
   generating a voltage waveform having a linear falling edge and applying said voltage waveform to a first node of at least one test memory cell;
   capturing an input voltage at said first node at a point in time when an output voltage at a second node of said at least one test memory cell rises above a first reference voltage during said falling edge;
   determining a difference between said input voltage, as captured at said point in time and any one of the following:
      said output voltage at said second node, as captured at an earlier point in time when said input voltage at said first node fell below said first reference voltage during said falling edge,
      a second reference voltage that is lower than said first reference voltage; and
      said difference being proportional to a static noise margin of said at least one test memory cell.

19. The static noise margin monitoring method of claim 18, said generating of said voltage waveform comprising generating any one of a sawtooth waveform and a triangular waveform.

20. The static noise margin monitoring method of claim 18, further comprising:
   repeating said capturing and said determining; and
   noting any changes in said difference, said changes being are indicative of corresponding changes in said static noise margin.

* * * * *